(12) United States Patent
Mirebrahim et al.

(10) Patent No.: US 11,519,628 B2
(45) Date of Patent: Dec. 6, 2022

(54) SYSTEM AND METHOD FOR OPTIMIZING ENERGY USE OF A STRUCTURE USING A CLUSTERING-BASED RULE-MINING APPROACH

(71) Applicants: Robert Bosch GmbH, Stuttgart (DE); Seyed Hamid Mirebrahim, Dublin, CA (US); Mohammad Shokooi-Yekta, Cupertino, CA (US); Unmesh Kurup, Sunnyvale, CA (US); Torsten Welfonder, Leonberg (DE); Mohak Shah, Dublin, CA (US)

(72) Inventors: Seyed Hamid Mirebrahim, Dublin, CA (US); Mohammad Shokooi-Yekta, Cupertino, CA (US); Unmesh Kurup, Sunnyvale, CA (US); Torsten Welfonder, Leonberg (DE); Mohak Shah, Dublin, CA (US)

(73) Assignee: Robert Bosch GmbH, Stuttgart (DE)

( * ) Notice: Subject to any disclaimer, the term of this patent is extended or adjusted under 35 U.S.C. 154(b) by 57 days.

(21) Appl. No.: 16/963,225

(22) PCT Filed: Jan. 18, 2019

(86) PCT No.: PCT/US2019/014126
§ 371 (c)(1),
(2) Date: Jul. 18, 2020

(87) PCT Pub. No.: WO2019/143889
PCT Pub. Date: Jul. 25, 2019

(65) Prior Publication Data
US 2021/0048215 A1    Feb. 18, 2021

Related U.S. Application Data

(60) Provisional application No. 62/619,267, filed on Jan. 19, 2018.

(51) Int. Cl.
*F24F 11/64*   (2018.01)
*G01K 13/00*   (2021.01)
(Continued)

(52) U.S. Cl.
CPC ............. *F24F 11/64* (2018.01); *G01K 13/00* (2013.01); *G01R 21/00* (2013.01); *G05B 19/042* (2013.01);
(Continued)

(58) Field of Classification Search
CPC .... F24F 11/64; F24F 2110/12; F24F 2110/00; F24F 11/62; G01K 13/00; G01R 21/00;
(Continued)

(56) References Cited

U.S. PATENT DOCUMENTS

| | | | | |
|---|---|---|---|---|
| 8,401,986 B1* | 3/2013 | Franke | .................... | G06F 16/21 706/47 |
| 2006/0004492 A1* | 1/2006 | Terlson | .................... | F24F 11/30 700/276 |

(Continued)

FOREIGN PATENT DOCUMENTS

| | | |
|---|---|---|
| CN | 105607508 A | 5/2016 |
| CN | 106022477 A | 10/2016 |

(Continued)

OTHER PUBLICATIONS

International Search Report corresponding to PCT Application No. PCT/US2019/014126, dated May 8, 2019 (3 pages).

*Primary Examiner* — Michael W Choi
(74) *Attorney, Agent, or Firm* — Maginot, Moore & Beck LLP

(57) ABSTRACT

A method of operating a heating ventilation and air conditioning (HVAC) system of a structure, includes collecting first sensor data corresponding to a parameter of the HVAC system, collecting second sensor data that is different than (Continued)

the first sensor data, and generating clustered data by clustering the first sensor data and the second sensor data into a plurality of data clusters with a controller. The method also includes forming a transactional dataset based on at least the first sensor data, the second sensor data, and the clustered data with the controller, performing association rule mining (ARM) on the transactional dataset to generate a plurality of rules for each data cluster of the plurality of data clusters with the controller, and changing an operating characteristic of the HVAC system based on the plurality of rules with the controller to optimize the parameter.

11 Claims, 4 Drawing Sheets

(51) Int. Cl.
G01R 21/00 (2006.01)
G05B 19/042 (2006.01)
F24F 110/12 (2018.01)

(52) U.S. Cl.
CPC ... *F24F 2110/12* (2018.01); *G05B 2219/2614* (2013.01)

(58) Field of Classification Search
CPC .......... G05B 19/042; G05B 2219/2614; G06N 5/025
See application file for complete search history.

(56) References Cited

U.S. PATENT DOCUMENTS

| | | |
|---|---|---|
| 2013/0289774 A1 | 10/2013 | Day et al. |
| 2015/0032267 A1 | 1/2015 | Lindelof et al. |
| 2015/0330650 A1 | 11/2015 | Abiprojo et al. |
| 2015/0332294 A1* | 11/2015 | Albert ............... G06Q 30/0202 705/7.31 |
| 2017/0109653 A1* | 4/2017 | Agarwal ............ H04Q 9/00 |
| 2017/0159982 A1 | 6/2017 | West |
| 2017/0285591 A1 | 10/2017 | Menzel |
| 2020/0012307 A1* | 1/2020 | Scelzi ................ G05B 11/01 |

FOREIGN PATENT DOCUMENTS

| | | |
|---|---|---|
| CN | 106066077 A | 11/2016 |
| CN | 106096790 A | 11/2016 |
| CN | 107250928 A | 10/2017 |
| EP | 2 902 720 A1 | 8/2015 |

* cited by examiner

SYSTEM AND METHOD FOR OPTIMIZING ENERGY USE OF A STRUCTURE USING A CLUSTERING-BASED RULE-MINING APPROACH

This application is a 35 U.S.C. § 371 National Stage Application of PCT/US2019/014126, filed on Jan. 8, 2019, which claims the benefit of priority of U.S. provisional application Ser. No. 62/619,267, filed on Jan. 19, 2018, the disclosures of which are incorporated herein by reference in their entirety.

FIELD

This disclosure relates to the field of energy consumption monitoring and, in particular, to improving and optimizing the operation of an energy consuming apparatus of a structure.

BACKGROUND

Commercial and residential structures typically include heating ventilation and air conditioning (HVAC) systems designed to keep occupants comfortable independent of the air temperature outside of the structure. For example, in a multistory commercial building, the HVAC system may include air conditioners, heat pumps, and/or gas furnaces that move conditioned air through each story of the building to ensure that the occupants are maintained at a comfortable temperature.

HVAC systems use electrical energy to produce the desired conditioned output. The amount of electrical energy consumed, however, depends on numerous factors, some of which include, the size of the structure, the number of occupants in the structure, and the outdoor temperature. In a large commercial structure, for example, the indoor air temperature is changed slowly and accounting for rapid changes in the outdoor temperature requires accurate forecasting skills. If the forecast is inaccurate, electrical energy is wasted and the cost to condition the structure is greater than is necessary. Moreover, the occupants may be uncomfortable during periods in which heavy demands are placed on the HVAC to change quickly the air temperature of the structure. Additionally, most commercial structures are relatively unoccupied during certain days of the year and, therefore, it is typically unnecessary to condition the entire structure during these days. Thus, to conserve electrical energy, operators of commercial structures may forecast these unoccupied days and make corresponding adjustments to the HVAC system. Residential structures are also subject to these considerations.

As set forth above, many factors are involved in the conditioning of a commercial structure or residential structure. In order to optimize the amount of electrical energy consumed by building systems, further developments are desired in the ability to forecast energy usage requirements.

SUMMARY

According to an exemplary embodiment of the disclosure, a method of operating a heating ventilation and air conditioning (HVAC) system of a structure, includes collecting first sensor data corresponding to a parameter of the HVAC system, collecting second sensor data that is different than the first sensor data, and generating clustered data by clustering the first sensor data and the second sensor data into a plurality of data clusters with a controller. The method also includes forming a transactional dataset based on at least the first sensor data, the second sensor data, and the clustered data with the controller, performing association rule mining (ARM) on the transactional dataset to generate a plurality of rules for each data cluster of the plurality of data clusters with the controller, and changing an operating characteristic of the HVAC system based on the plurality of rules with the controller to optimize the parameter.

According to another exemplary embodiment of the disclosure, an energy control system for controlling an HVAC system of a structure includes a first sensor, a second sensor, and a controller. The first sensor is operably connected to the HVAC system and is configured to generate first sensor data corresponding to a parameter of the HVAC system. The second sensor is operably connected to the structure and is configured to generate second sensor data that is different than the first sensor data. The controller is operably connected to the first sensor and the second sensor. The controller is configured to execute program instructions to generate clustered data by clustering the first sensor data and the second sensor data into a plurality of data clusters, to form a transactional dataset based on at least the first sensor data, the second sensor data, and the clustered data, to perform association rule mining (ARM) on the transactional dataset to generate a plurality of rules for each data cluster of the plurality of data clusters, and to change an operating characteristic of the HVAC system based on the plurality of rules to optimize the parameter.

BRIEF DESCRIPTION OF THE FIGURES

The above-described features and advantages, as well as others, should become more readily apparent to those of ordinary skill in the art by reference to the following detailed description and the accompanying figures in which.

DETAILED DESCRIPTION

Figure 1:
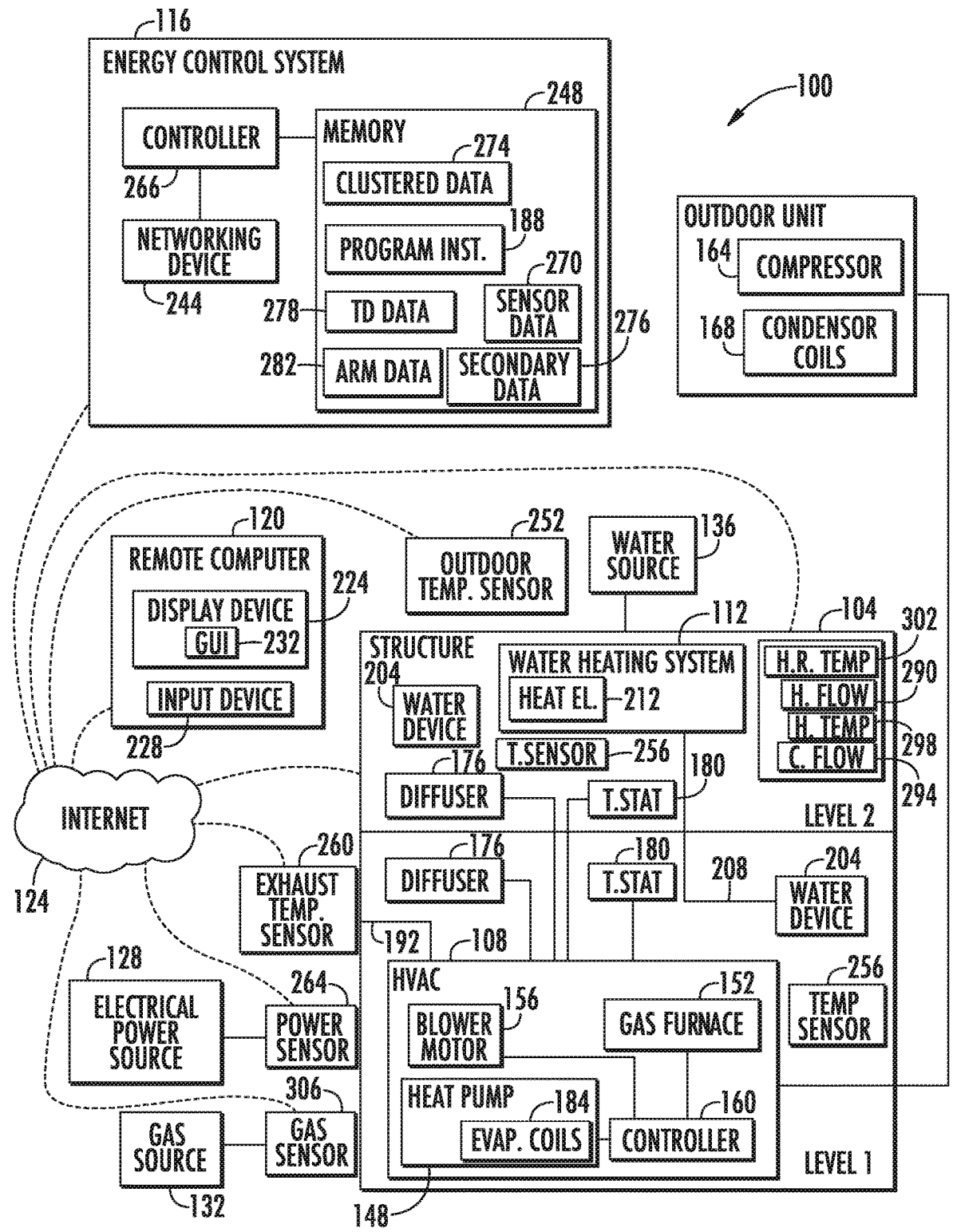
FIG. 1 is a block diagram view of a system, as disclosed herein, that includes an energy control system configured to optimize operation of an HVAC system of a structure.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

Aspects of the disclosure are disclosed in the accompanying description. Alternate embodiments of the disclosure and their equivalents may be devised without parting from the spirit or scope of the disclosure. It should be noted that any discussion herein regarding "one embodiment", "an embodiment", "an exemplary embodiment", and the like indicate that the embodiment described may include a particular feature, structure, or characteristic, and that such particular feature, structure, or characteristic may not necessarily be included in every embodiment. In addition, references to the foregoing do not necessarily comprise a reference to the same embodiment. Finally, irrespective of whether it is explicitly described, one of ordinary skill in the art would readily appreciate that each of the particular features, structures, or characteristics of the given embodiments may be utilized in connection or combination with those of any other embodiment discussed herein.

For the purposes of the disclosure, the phrase "A and/or B" means (A), (B), or (A and B). For the purposes of the disclosure, the phrase "A, B, and/or C" means (A), (B), (C), (A and B), (A and C), (B and C), or (A, B and C).

The terms "comprising," "including," "having," and the like, as used with respect to embodiments of the disclosure, are synonymous.

As shown in FIG. 1, a system 100 includes a structure 104 having an HVAC system 108, a water heating system 112, an energy control system 116, and a remote computer 120. At least the structure 104, the energy control system 116, and the remote computer 120 are operably connected to the Internet 124. An electrical power source 128, a gas source 132, and a water source 136 are operably connected to the structure 104. The structure 104, in one embodiment, is a commercial structure and two levels (i.e. level 1 and level 2) of the structure 104 are illustrated.

As described herein, the energy control system 116 is configured to optimize energy usage of at least the HVAC system 108. Specially, the energy control system 116 uses cluster analysis and data mining to identify patterns within the energy consumption of the structure 104. The cluster analysis is used to identify patterns in energy usage data. These clusters are then related to heterogeneous information from both internal sources (e.g. other building sensors such as hot water usage and ventilation settings) and external sources (e.g. temporal information broken down into ranges such as morning/afternoon/evening/night/weekday/weekend, etc.). In one embodiment, the energy control system 116 identifies these relationships according to an association rule mining (ARM) approach. The energy usage of the structure 104 is optimized (either automatically or with a human-in-the-loop approach) according to the rules and relationships that are identified by the energy control system 116. Therefore, the system 100 improves operation of the HVAC system 108 by reducing the electrical energy required to operate the structure 104, while maintaining occupant comfort. Each element of the system 100 is described herein along with an exemplary method operating the system 100.

With reference to FIG. 1, the exemplary structure 104 is illustrated as a multi-story building having at least two stories or two levels. The structure 104 is a commercial building or a residential building. The structure 104 is operably connected to the gas source 132, which provides a supply of natural gas to the structure 104. The structure 104 is also operably connected to the electrical power source 128, which provides a supply of electrical energy to the structure 104. Moreover, the structure 104 is operably connected to the water source 136, which provides a supply of water to the structure 104. In other embodiments, the structure 104 may have any number of levels.

The HVAC system 108 includes an indoor unit having at least one heat pump 148, at least one gas furnace 152, at least one blower motor 156, and at least one thermostat 180 each operably connected to a controller 160. The HVAC system 108 also includes an outdoor unit including at least one compressor 164 and at least one condenser coil 168. Duct work 172 and diffusors 176 of the HVAC system 108 form a conduit configured to move air from the indoor unit to each level of the structure 104. Depending on the size of the structure 104, the structure 104 may include one indoor unit and one outdoor unit, or the structure 104 may include a plurality of indoor units and a plurality of outdoor units.

The heat pump 148 is configured to generate hot air for heating the interior space of the structure 104 and cool air for cooling the interior space of the structure 104 (e.g. the heat pump 148 is configurable as an air conditioner). The heat pump 148 includes evaporator coils 184 that are typically located inside of the structure 104. To generate hot air for heating the structure 104, the heat pump 148 moves heat from the outdoor unit to the evaporator coils 184, and the blower motor 156 moves the heat through the structure 104 using the duct work 172 and the diffusors 176. To generate cool air for cooling the structure 104, the heat pump 148 moves heat from the evaporator coils 184 to the outdoor unit and the blower motor 156 moves the cooled air through the structure 104 using the duct work 172 and the diffusors 176. The heat pump 148 is operably connected to the energy control system 116. Depending on the size of the structure 104, the heat pump 148 may use many thousands of kilowatt hours (kWh) to heat and/or to cool the structure 104.

The gas furnace 152 is connected to the gas source 132 and is configured to burn gas from the gas source 132. The blower motor 156 moves air through the gas furnace 152 to generate hot air that is moved through the structure 104 by way of the duct work 172 and the diffusors 176. The gas furnace 152, in one embodiment, is operably connected to the energy control system 116.

As shown in FIG. 1, the controller 160 of the HVAC system 108 is configured to execute program instruction data 188 for controlling the air temperature within the structure 104. Specifically, the controller 160 is configured to operate the HVAC system 108 in at least four modes including a first heating mode using the heat pump 148, a second heating mode using the gas furnace 152, a cooling mode using the heat pump 148, and a ventilation mode using only the blower motor 156. In the ventilation mode, ambient temperature air is moved through the structure 104 by the blower motor 156 without being heated or cooled by the heat pump 148 or the gas furnace 152. The moved air is then ventilated or exhausted to the outside. The HVAC system 108 is also operable in a recirculation mode in which heated air, cooled air, and/or ambient temperature air is moved through the structure 104 by the blower motor 156 without ventilating or exhausting the air to the outside, such that the same air is moved through the structure 104 repeatedly. The controller 160 is provided as a microprocessor, a processor, or any other type of electronic control chip.

In one embodiment, the diffusors 176 are connected to the controller 160 and are electronically configurable in an open state and a closed stated. In the open state, the diffusors 176 diffuse conditioned air into a particular room or level of the structure 104. In the closed state, the diffusors 176 block the flow of conditioned air to a selected room or a selected level of the structure 104. Accordingly, the electrically configurable diffusors 176 enable the HVAC system 108 to selectively condition a room(s) or a level(s) of the structure 104 while leaving other rooms or levels of the structure 104 unconditioned.

Each thermostat 180 is configured to generate an electronic temperature signal corresponding to a temperature of the level of the structure 104 in which the thermostat 180 is located. The HVAC system 108 determines when to operate the heat pump 148, the gas furnace 152, and the blower motor 156 based on the electronic temperature signal generated by the thermostat 180.

The HVAC system 108, in at least one embodiment, includes an exhaust vent 192 that directs air from the indoor unit within the structure 104 to the area outside of the structure 104.

The water heating system 112 is operably connected to water devices 204 throughout the structure 104 by plumbing 208. The water heating system 112 includes a heating element 212 for heating water contained therein. The heating element 212 is electrically connected to the electrical power source 128 or the gas source 132. The water devices 204 include sinks, dishwaters, clothes washers, showers, and bathtubs. In a commercial setting the water device 204 includes any other device that requires a supply of hot water for operation.

The remote computer 120 is connected to the Internet 124 and includes a display device 224, such as a computer monitor, and an input device 228, such as keyboard and mouse. The remote computer 120 is configured to display a graphical user interface 232 (GUI) that enables a user of the remote computer 120 to control the energy control system 116, the HVAC system 108, and the water heating system 112 from a remote location by sending electronic data over the Internet 124.

As shown in FIG. 1, the energy control system 116 includes a networking device 244, a memory 248, an outdoor air temperature sensor 252, at least one an indoor air temperature sensor 256, an HVAC exhaust air temperature sensor 260, and at least one electrical power sensor 264 each operably connected to a controller 266. The networking device 244 operably connects the energy control system 116 to the Internet 124, such that the energy control system 116 is configured to receive electronic data from other Internet-connected devices and to send electronic data to other Internet-connected devices. In the exemplary embodiment, the energy control system 116 is shown in a location that is remote from the structure 104. In other embodiments, the energy control system 116 is located within the structure 104. In a specific embodiment, the energy control system 116 is located within the structure 104 and is electrically connected directly to the HVAC system 108.

The memory 248 of the energy control system 116 is an electronic data storage unit, which is also referred to herein as a non-transient computer readable medium. The memory 248 is configured to store the program instruction data 188 as well as sensor data 270, clustered data 274, secondary data 276, transactional dataset data 278, and ARM data 282. Moreover, the memory 248 is configured to store any other electronic data associated with the system 100. The program instruction data 188 includes computer executable instructions for operating the energy control system 116.

The outdoor air temperature sensor 252 of the energy control system 116 is configured to generate electrical outdoor air temperature data (i.e. second sensor data) corresponding to an outdoor air temperature at the structure 104, which is also referred to herein as an ambient temperature or an ambient outdoor temperature. As shown in FIG. 1, the outdoor air temperature sensor 252 is operably connected to the energy control system 116 by the Internet 124. Additionally or alternatively, the outdoor air temperature sensor 252 is directly electrical connected to the energy control system 116.

The indoor air temperature sensor(s) 256 of the energy control system 116 is configured to generate electrical indoor air temperature data corresponding to an indoor air temperature at a particular location of the structure 104. For example, in one embodiment, each level of the structure 104 includes an indoor air temperature sensor 256 so that indoor air temperature data is generated for each level of the structure 104, including first indoor air temperature data and second indoor air temperature data. The indoor air temperature sensor 256 is operably connected to the energy control system 116 by the Internet 124.

The exhaust air temperature sensor 260 of the energy control system 116 is configured to generate electrical exhaust air temperature data corresponding to an air temperature of the HVAC exhaust vent 192. As shown in FIG. 1, the exhaust air temperature sensor 260 is operably connected to the energy control system 116 by the Internet 124.

The power sensor 264 is an electrical power sensor that is configured to generate electrical power data (i.e. first sensor data). For example, the power sensor 264 is configured to generate first electrical power data corresponding to the electrical power consumed by the HVAC system 108. Thus, depending on the configuration of the HVAC system 108, the power sensor 264 generates electrical heating power data, electrical cooling power data, and/or electrical ventilation power data.

The controller 266 of the energy control system 116 is configured to execute the program instruction data 188 for controlling the energy control system 116. The controller 266 is provided as a microprocessor, a processor, or any other type of electronic control chip.

Additionally, in some embodiments, the energy control system 116 includes a hot water volume flow sensor 290, a cold water volume flow sensor 294, a hot water output temperature sensor 298, and a hot water return temperature sensor 302 each operably connected to the Internet 124. The hot water volume flow sensor 290 is configured to generate electronic hot water flow data corresponding to a flow rate of hot water through the water heating system 112 or out of the hot water heating system 112. The cold water volume flow sensor 294 is configured to generate electronic cold water flow data corresponding to a flow rate of cold water consumed by the water devices 204 of the structure 112. The hot water output temperature sensor 298 is configured to generate electronic hot water return temperature data corresponding to a temperature of the water that is output from the water heating system 112 to the water devices 204. The hot water return temperature sensor 302 is configured to generate electronic hot water return temperature data corresponding to a temperature of the water that is circulated back to the water heating system 112 from the water devices 204.

In some embodiments, the energy control system 116 includes a gas sensor 306. The gas sensor 306 is configured to measure a quantity of gas used by the gas furnace 152 to heat the structure 104. The gas sensor 306 generates electronic gas volume data corresponding to the measured quantity of gas. The gas sensor 306 is operably connected to the energy control system 116 by the Internet 124.

In operation, the system 100 is configured to implement a method 350 (FIG. 2) of operating the HVAC system 108 to use electrical energy and/or natural gas efficiently while maintaining occupant comfort within the structure. The system 100 is also useful for identifying long-term energy consumption patterns. Recently, there is an increased emphasis on the use of machine learning techniques for energy data analysis with multiple serious commercial service providers in the market. The energy control system 116 is suitable for use with residential structures, smaller commercial buildings with well understood single-use profiles, as well as larger commercial buildings like office spaces with more complex with multiple HVAC units 108, different comfort zones and varying patterns of use, such as the structure 104.

Figure 2:
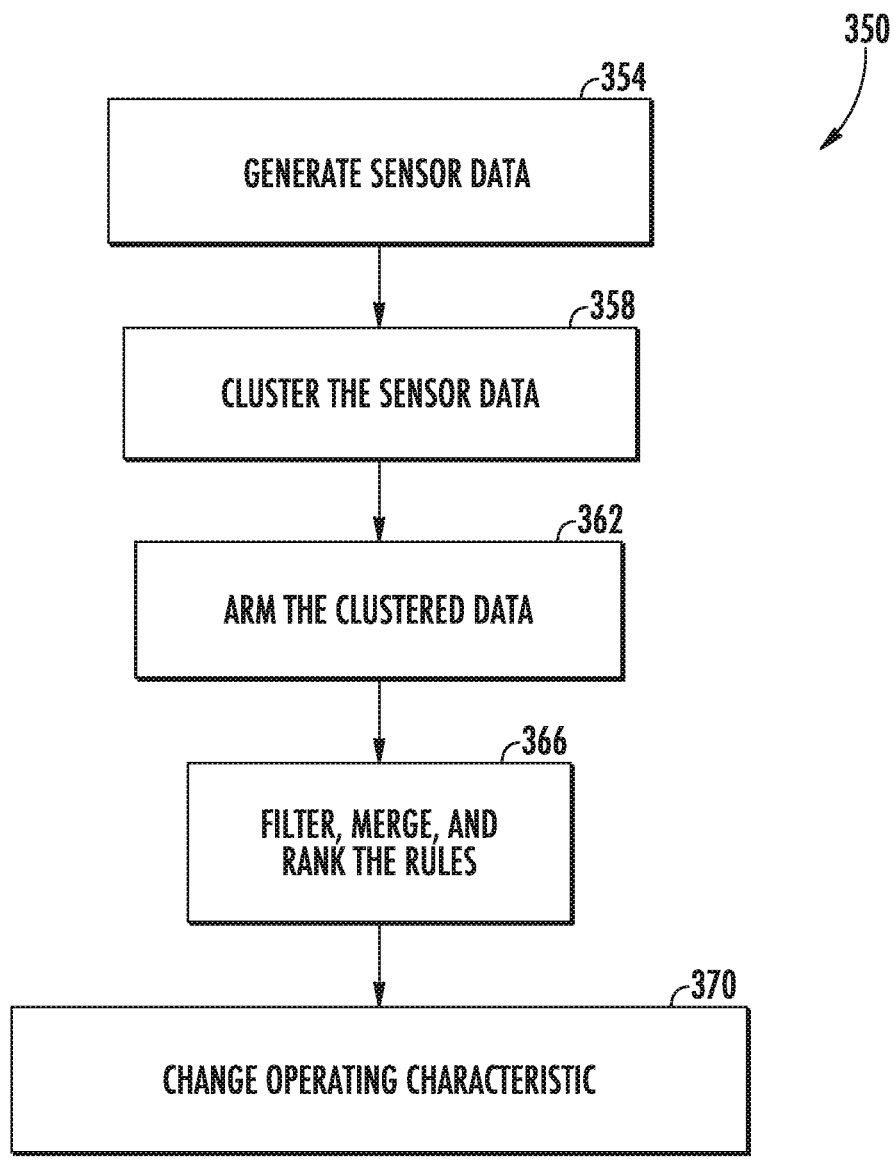
FIG. 2 is a flowchart illustrating an exemplary method of operating the HVAC system with the energy control system of FIG. 1.
Figure 3:
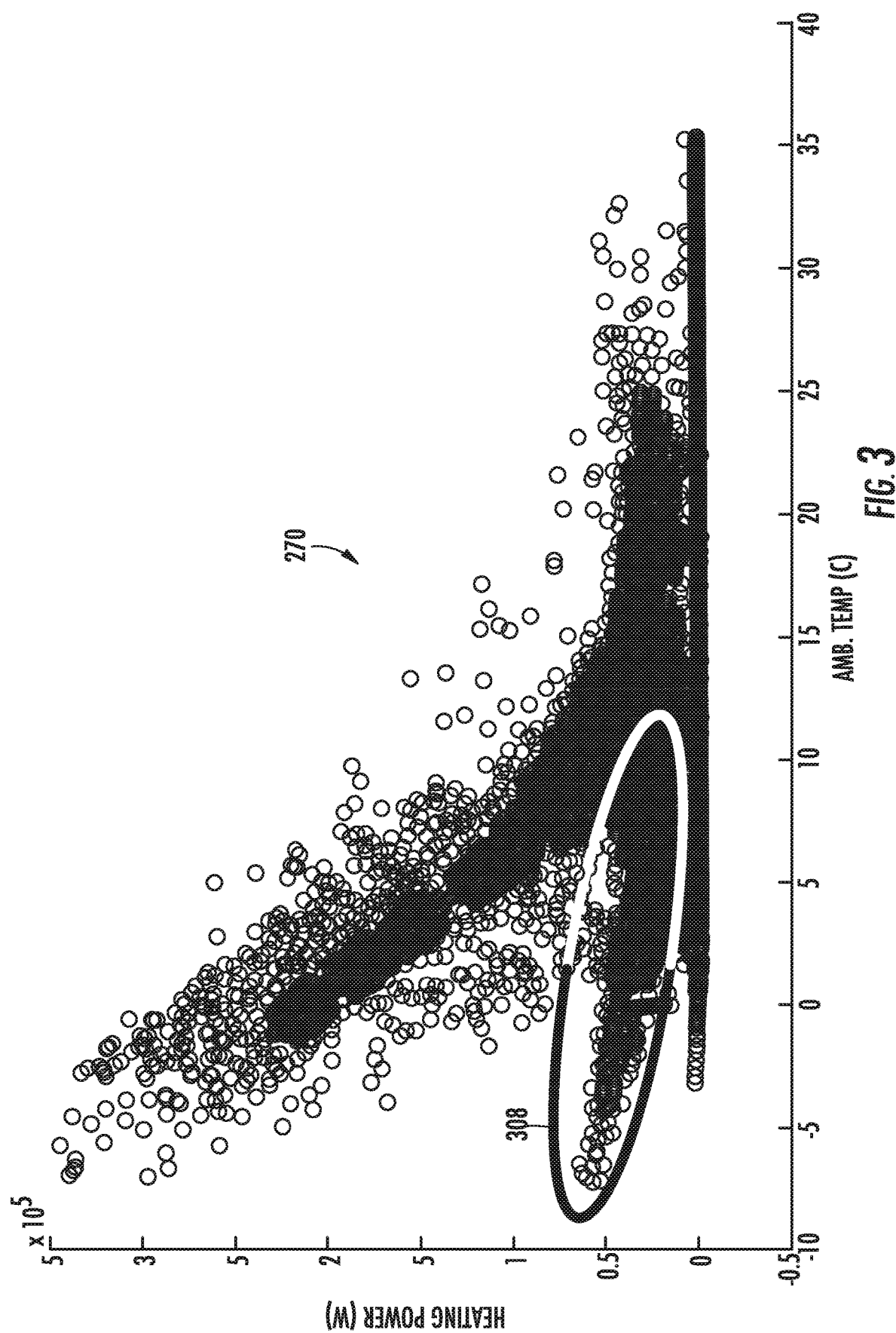
FIG. 3 is a plot of electrical heating power consumed by the HVAC system of FIG. 1 versus outdoor ambient temperature.

The method 350 is exemplified by the flowchart of FIG. 2. As shown in FIG. 2, at block 354, the method includes generating the electronic sensor data 270. The sensor data 270 includes at least electrical power heating data (i.e. first sensor data) generated by the power sensor 264 and outdoor ambient temperature data (i.e. second sensor data) generated by the outdoor temperature sensor 252. Exemplary sensor data 270 is plotted in the chart of FIG. 3. The heating data represents the amount of electrical energy/power consumed by the HVAC system 108 to heat the interior space of the structure 104 to a desired temperature (i.e. a predetermined temperature or a set point temperature). In an example, one data point of the sensor data 270 is generated every hour, such that twenty-four data points are generated in one day. In one embodiment, the energy control system 116 stores one year of the sensor data 270 associated with the monitored parameter of the HVAC system 108, such as electrical power consumption. Any other rate of sensor data 270 generation may be utilized as is appropriate for the monitored parameter.

Interpreting the relationships exhibited by the sensor data 270 may be difficult for a human building operator. Specifically, there are some discernable trends shown in FIG. 3 with more electrical power being used when temperatures are lower, but there are also clearly distinct areas, like the circled region 308, at which it is not immediately apparent what this region 308 of sensor data 270 represents. The method 350 is provides insights into this analysis.

Block 354 of the method 350 may include generating the sensor data 270 with any of the other sensors of the energy control system 116. For example, electrical power cooling data is generated using the power sensor 264, which corresponds to the amount of electricity required to cool the structure 104 to a desired temperature (e.g. a predetermined temperature or a set point temperature). Similarly, gas heating data is generated using the gas sensor 306. The gas heating data corresponds to the amount of gas required to heat the structure 104 to a desired temperature (e.g. a predetermined temperature or a set point temperature). The gas consumption is another exemplary parameter of the HVAC system 108 that may be optimized by the energy control system 116.

The sensor data 270 is transmitted from the corresponding sensor to the controller 266 of the energy control system 116. The sensor data 270 may be transmitted directly to the energy control system 116 or transmitted indirectly to the energy control system 116 via the Internet 124. The energy control system 116 stores the transmitted sensor data 270 in the memory 248.

After receiving the sensor data 270, the controller 266 of the energy control system 116 executes the program instructions 188 and processes the sensor data 270 to prepare the sensor data 270 for analysis. For example, the controller 266 performs data cleaning and preparation steps on the sensor data 270 including aligning the sensor data 270 values by timestamps, performing data imputation (or subsampling) during timestamp alignment, and removing outlier data points of the sensor data 270. Any other data processing or preparation technique may be utilized by the controller 266.

Figure 4:
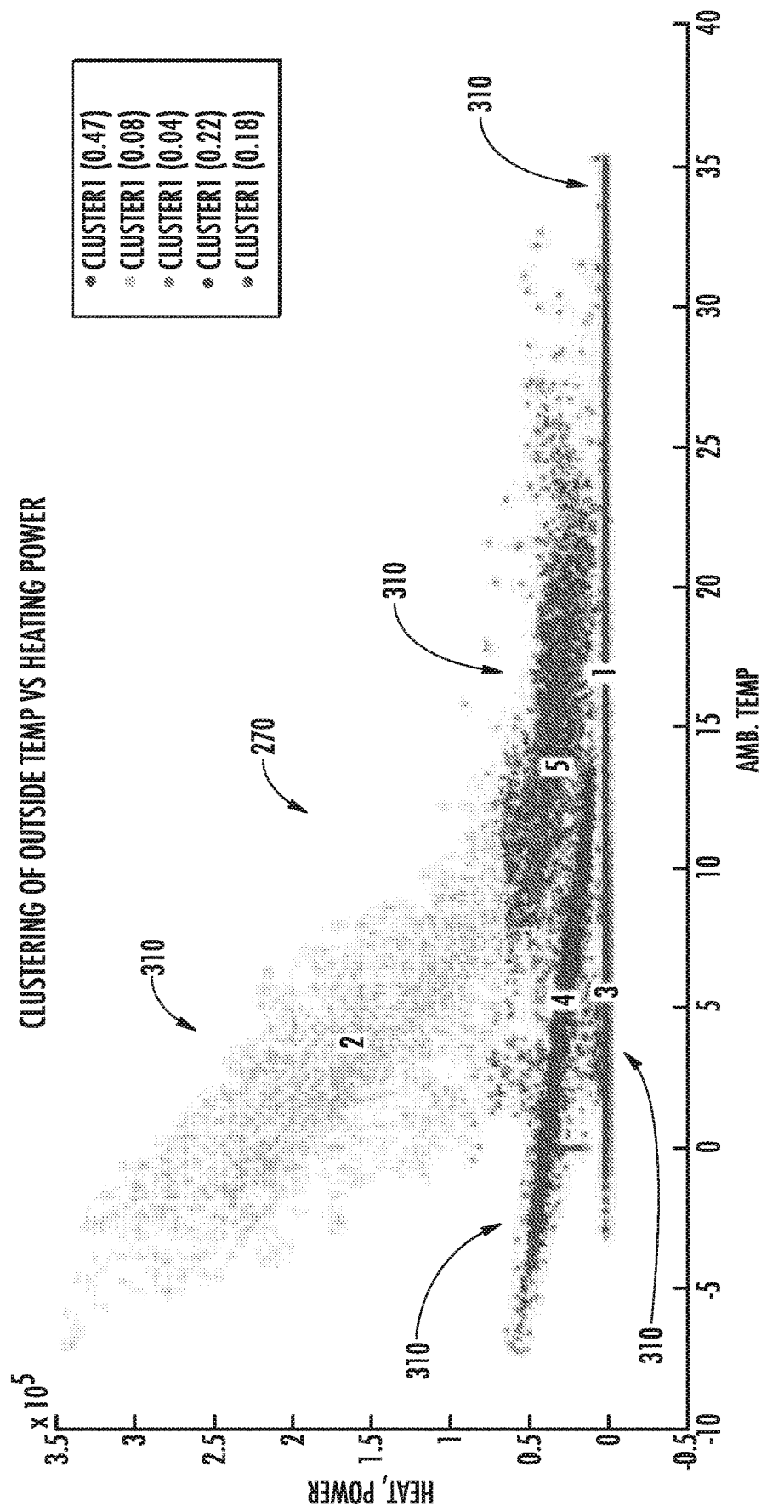
FIG. 4 is a depiction of the plot of FIG. 3 after clustering the data points into a plurality of data clusters.

Next, at block 358 of the method 350, the controller 266 executes the program instructions 188 and performs cluster analysis on the sensor data 270 (i.e. the first sensor data and the second sensor data) to generate the clustered data 274. The clustered data 274 is stored in the memory 248 of the energy control system 116 as a plurality of data clusters. FIG. 4 illustrates a plot of the sensor data 270 after undergoing cluster analysis. In FIG. 4, the cluster analysis has grouped the sensor data 270 into five data clusters 310 numbered from one to five as a "cluster ID" of the clusters 310. The clustering of the sensor data 270 is automatically performed without human intervention using a clustering algorithm that is stored in the memory 248 as the program instructions 188.

The controller 266 may utilize any one or more clustering algorithms, such as Gaussian Mixture Models (GMMs), k-means, and hierarchical clustering in clustering the sensor data 270. In FIG. 4, GMMs was applied to the sensor data 270. In some embodiments, GMMs tends to generate better optimized results than k-means and hierarchical clustering due to the non-linear nature of temperature versus power consumption data, which typically occurs in cold-weather areas.

GMMs have two parameters that can be set—the number of iterations to convergence (iterations) and the number of random restarts (repetitions). In generating the clustered data 274 of FIG. 4, these numbers were set to 500 and 100 respectively after running a number of experiments. GMMs can take the maximum number of possible clusters 310 as a parameter and return the best clustering found.

The program instructions 188 are configured to optimize the number of clusters 310 into which the sensor data 270 is grouped. In one embodiment, the maximum number of clusters 310 is from three to ten. For example, the maximum number of clusters 310 is determined by taking the log-likelihood of the resulting clusters 310 and selecting the smallest cluster number beyond which the gain in log-likelihood was negligible. Such an approach roughly translates to finding the "elbow" in the graph of number of clusters 310 versus the log-likelihood.

In some embodiments, the energy control system 116 is configured to delete the sensor data 270 that is grouped into a cluster 310 having fewer than a predetermined number of data points. For example, the clustering algorithm may result in ten clusters 310 with three clusters 310 having fewer than five data points of the sensor data 270 each. The controller 266 may determine that the sensor data 270 of the three clusters 310 should be ignored, or the controller 266 may delete the sensor data 270 of the corresponding three clusters 310.

In one embodiment, the controller 266 stores the clustered data 274 as a plurality of triplets. An exemplary triplet may be (10, 0.5, 5), stored in the format of (ambient temperature, heating power ($\times 10^5$), cluster ID). The cluster ID is an identification of the cluster 310 to which the temperature and heating power are assigned as a result of the cluster analysis.

Next, in block 362 of the method 350, ARM is performed on the clustered data 274 and, in some embodiments, secondary data 276 from additional sensors of the energy control system 116. The energy control system 116 uses ARM to find relationships and correlations between the clustered data 274 and the secondary data 276. In at least some embodiments, the secondary data 276 corresponds to an operating state of the HVAC system 108 or includes data from additional sensors, such as the hot water volume flow sensor 290, the cold water volume flow sensor 294, the hot water output temperature sensor 298, and the hot water return temperature sensor 302. An exemplary ARM approach of the energy control system 116 is described below.

ARM algorithms are typically applied to transactional datasets (TD). To develop the TD, the method 350 includes first developing in an input dataset that is shown below as Table 1. Table 1 is based on the sensor data 270 (i.e. the first sensor data and the second sensor data), the clustered data 274, and the secondary data 276.

TABLE 1

Input Dataset

| Cluster 1 | Cluster 2 | Cluster 3 | 0 ≤ Temp < 10 | 10 ≤ Temp < 20 | Vent. On | Vent. Off | Recirc. |
|---|---|---|---|---|---|---|---|
| 1 | 0 | 0 | 0 | 1 | 1 | 0 | 0 |
| 0 | 1 | 0 | 1 | 0 | 1 | 0 | 0 |
| 1 | 0 | 0 | 1 | 0 | 1 | 0 | 0 |
| 0 | 0 | 1 | 1 | 0 | 0 | 0 | 1 |
| 0 | 1 | 0 | 1 | 0 | 0 | 1 | 0 |

In Table 1, each row corresponds to a triplet of the sensor data 270 and the clustered data 274, which has identified three clusters 310. Moreover, in Table 1, the ambient temperature (as sensed by the outdoor temperature sensor 252) has been divided into two columns based on the corresponding measured value. A "1" in the temperature columns indicates that the clustered data 274 in that row corresponds to a temperature within the identified range of temperatures for that column. Whereas, a "0" in temperature columns indicates that the clustered data 274 is outside of the identified range of temperatures.

In Table 1, the secondary data 276 includes the ventilation and the recirculation data. The "Vent. On" column corresponds to having the blower motor 156 powered on and moving air through the structure 104. Specifically, a "1" in the Vent. On column indicates that the blower motor 156 is energized for that data row, and a "0" in the Vent. On column indicates that the blower motor 156 is not energized for that data row. The "Vent. Off" column corresponds to having the blower motor 156 powered off and not moving air through the structure 104. A "1" in the Vent. Off column indicates that the blower motor 156 is de-energized (or not energized) for that data row, and a "0" in the Vent. Off column indicates that the blower motor 156 is energized for that data row. The "Recirc." column identifies if the HVAC system 108 is set in recirculation mode (as indicated by a "1") or is not set in recirculation mode (as indicated by a "0").

The secondary data 276 enables the method 350 to develop rules during the ARM process that provide insight into an evaluated usage parameter (i.e. electricity usage, gas usage, etc.) in relation to the secondary data 276. The ventilation and blower motor 156 status are exemplary sources of the secondary data 276. Other sources of secondary data 276 include data from the sensors 290, 294, 298, 302 connected to the water heating system 112. The secondary data 276 provided by these sensors 290, 294, 298, 302 enables the energy control system 116 to developing interesting and/or insightful rules during the ARM approach that may not have otherwise been realized by human observes. Other secondary data 276 include a setpoint temperature of the thermostats 180, the state data of the diffusors 176, and the exhaust temperature of the HVAC system 108 as determined by the exhaust temperature sensor 260.

The number of columns of the input dataset per sensor depends on the whether the sensor values are discrete or continuous. For example, a single column is added to the input dataset for each value of a discrete sensor, such as the ventilation status of the blower motor 156. An entry in this column is "1" if the sensor has this particular value. In an exemplary embodiment, a sensor is considered to be discrete if there are fewer than five distinct values for that sensor in the dataset. For the continuous sensors (such as the outdoor temperature sensor 252), the values are mapped to a discrete space before applying the ARM algorithm. For example, the energy control system 116 divides the range of sensor values into quantiles (with quintiles as the default) in order to evenly space out the data. A column is added to the input dataset for each interval of the divided range of values. For a particular column formed in this way, the value will be set to "1" for a specific time point if the corresponding value is in this interval.

Next, to describe further block 362 of the method 350, the energy control system 116 builds a TD based on the input dataset. As described above, ARM is typically performed on a TD thus, the data of the input dataset is converted by the controller 266 into a TD-like table, which is referred to herein simply as a TD (i.e. a transactional dataset) and is saved at the TD data 278. An exemplary TD based on the input dataset of Table 1 is shown below as Table 2.

TABLE 2

Transactional Dataset ("TD")

| Cluster ID | Temp. | Ventilation |
|---|---|---|
| 1 | 13 | On |
| 2 | 7 | On |
| 1 | 3.5 | On |
| 3 | 2 | Recirc. |
| 2 | 0 | Off |

In the TD of Table 2, each row corresponds to a row of the input dataset. For example, row 1 of the TD includes a "1" in the cluster ID column because as shown in row 1 of the input dataset, the first row corresponds to the cluster ID 1. The first row of the TD includes a "13" in the temperature column because that is the corresponding value stored at row 1 of the input data set. The first row of the TD also includes an "On" value in the ventilation column because that is the corresponding value from the first row of the input dataset. The rest of the TD data 278 is built by the energy control system 116 in a corresponding manner. The TD data 278 has compressed the two columns of the input dataset corresponding to temperature into one column, and the TD data 278 has compressed the three columns corresponding to ventilation (i.e. secondary data 276) into one column.

Next, the energy control system 116 performs ARM on the TD data 278 to generate a plurality of rules for each data cluster 310 of the clustered data 274. The rules are saved to the memory 248 as the ARM data 282. ARM algorithms are useful for finding interesting, important, and, sometimes, rare correlations and associations among sets of items (a.k.a. datasets) in a TD. ARM algorithms find implication expressions of the form A→B (i.e. an example rule). The example rule means that if the TD includes data "A" then data "B" is typically the result.

Two common metrics used with ARM algorithms are support and confidence. The support of a rule A→B is the proportion of transactions (e.g. rows of data) in the TD containing both A and B. Confidence is the proportion of the transactions in the TD containing A, which also contain B. The Apriori algorithm and the FP-Tree method are suitable techniques used by the energy control system 116 to perform ARM on the TD data 278. ARM is also useful for discovering negative rules. A negative rule finds an association between a dataset entry and an absence of another entry in the TD data 278. Negative rules are typically an informative complement to positive association rules for some applications.

The energy control system 116 uses ARM to find a relationship between the evaluated parameter and the secondary data 276. For example, in one embodiment, the energy control system 116 uses ARM to find relationships between occupant activity and electricity consumption, thereby providing a basis for energy demand characterization. In other embodiments, the energy control system 116 uses ARM techniques to understand individual appliance energy consumption patterns and the interrelationship in usage of appliances.

The following exemplary rules of the ARM data 282 were generated according to the method 350 by the energy control system 116 based on the TD of Table 2. In practice, the energy control system 116 may generate thousands of rules based on TD data 278 containing a year's worth of data, such as the data of FIG. 3.

$$\text{Cluster 1} \rightarrow 0 < \text{Heat. Power} < 2000 \quad \text{(Rule 1)}$$

$$\text{Cluster 4} \rightarrow -10 < \text{Amb. Temp} < 15 \quad \text{(Rule 2)}$$

According to Rule 1, when the sensor data 270 is clustered into the cluster 310 having an ID of "1" then, typically, the heating power will be between zero and two thousand× $10^5$ W. Rule 1 has an associated support and confidence and, based thereon, may provide insight into the energy demands of the HVAC system 108.

According to Rule 2, when the sensor data 270 is clustered into the cluster 310 having an ID of "4" then, typically, the ambient temperature measured by the outdoor temperature sensor 252 will be between −10° C. and 15° C. Rule 2 has an associated support and confidence and, based thereon, may provide insight into the energy demands of the HVAC system 108.

Next, as shown block 366 of the flowchart of FIG. 2, the method 350 performed by the energy control system 116 filters, merges, and ranks the rules generated by ARM to determine the rules that provide the most insight into the operation of the HVAC system 104. The ARM process generates a large number of rules, many of which may be unhelpful in terms of interpreting the meaning of the clusters 310. The filtering step of the method 350 detects and eliminates uninformative or uninteresting rules from the ARM data 282 and identifies pertinent rules that are informative or interesting.

In practice, detecting the most interesting or insightful rules (i.e. the pertinent rules) based on objective measures can be a challenging task. Accordingly, in some embodiments, a human expert scores/ranks at least a subset of the discovered rules. Then, the remainder of the discovered rules are scored/ranked with the controller 266 of the energy control system 116. The rules that are determined to be ranked the lowest in terms of interestingness and informativeness are filtered or removed from the ARM data 282. The rules having a high ranking are identified as pertinent rules and are saved in the ARM data 282.

In addition to support and confidence, there are several other measures to rank the rules of the ARM data 282. There is typically no one best metric that suits all conditions; accordingly, the method 350, in one embodiment, utilizes a hybrid approach for ranking the rules. For example, a human expert calculates several metrics for the discovered rule set of the ARM data 282 and ranks a subset of the rules based on the metrics (and different combinations of the metrics). Then the method 350 applies the Lift metric to the ranked rules and also the remainder of the rules. Lift is a measure of the performance of a rule at predicting or classifying cases as having an enhanced response with respect to the population as a whole. Thus, in one embodiment, the Lift value of a rule is defined as a ratio of the target response divided by the average response. The Lift value is also defined as a ratio of the proportion of the number of data points belonging to the cluster specified in the LHS (left hand side) that have the sensor value given in the RHS (right hand side) to the proportion of data points belonging to this cluster that would have the sensor value given in the RHS if the data were uniformly distributed. As an example of the Lift value, consider a cluster having an ID of "C1" with 1000 data points, and the following Rule 3 about cluster C1:

$$\text{Cluster C1} \rightarrow \text{Weekend} \quad \text{(Rule 3)}$$

In Rule 3, half the points in the cluster C1 satisfy the rule, i.e., 500 points in cluster C1 were collected over the weekend. If the input data were uniformly distributed, then $2/7$th of the points (~286 points) should to belong to the weekend. Thus, the Lift value for the exemplary Rule 3 is 1.75 (500/286).

A rule with a Lift value of one indicates that the rule only captures what we expected to see in the data if it has a uniform distribution. Deviations of the Lift value in either direction from one by more than a predetermined margin indicates interestingness and the larger the deviation from one, the more interesting the rule. In one embodiment, the operating characteristic of the HVAC system 108 is changed based on only a plurality of pertinent rules of the ARM data 282.

As noted above, block 366 of the method 350 also includes discriminating the rules of the ARM data 282. Many of the rules discovered for a particular cluster 310 may appear in other clusters 310 as well, usually with a different support and confidence (or any other score). Finding the rules which appear in just a single cluster 310 or that appear in other clusters 310 with a much lower score is helpful in understanding the meaning of the clusters 310. Such rules are referred to herein as "discriminative rules." To find discriminative rules, first the scores calculated for each of the rules are normalized by the number of points in a cluster 310. Then, the top n rules of each cluster 310 are compared to the top rules in other clusters 310. If a rule in a particular cluster 310 does not appear in any other cluster 310 or appears with a score less than some multiplier of the score of this rule, it is marked as a discriminative rule. Discriminative rules can help the user realize the conditions under which one should expect to observe the system in a particular cluster 310 with a high confidence.

Block 366 of the method 350 also includes merging the rules of the ARM data 282 to form a plurality of merged rules. For example, in some cases, a quantile-based division of sensors can lead to clusters 310 that span an adjacent sensor-quantile. These show up as rules that can be combined or merged together to form a single rule. For example, considering the following rules in which Rules 4 and 5 can be merged into Rule 6.

$$\text{Cluster 4} \rightarrow -10 \leq \text{Amb. Temp.} < 5 \quad \text{(Rule 4)}$$

$$\text{Cluster 4} \rightarrow 5 \leq \text{Amb. Temp.} < 15 \quad \text{(Rule 5)}$$

$$\text{Cluster 4} \rightarrow -10 < \text{Amb. Temp.} < 15 \quad \text{(Rule 6)}$$

As shown, the ranges of ambient temperature as determined by the outdoor temperature sensor 252 have some overlap between Rules 4 and 5. Rule 6 therefore is a merged rule that has a range of ambient temperature that encompasses the ranges of Rules 4 and 5. When the ARM data 282 is modified by the controller 266 to include Rule 6, in one embodiment, Rules 4 and 5 are removed from the ARM data 282. Moreover, the support and confidence values for the merged Rule 6 are calculated easily, based on the following formulas:

Support(Rule 6)=support(Rule 4)+support(Rule 5)

Confidence(Rule 6)=Confidence(Rule 4)+Confidence (Rule 5)

In one embodiment, the operating characteristic of the HVAC system 108 is changed based on only a plurality of merged rules.

Moreover, in some embodiments, the controller 266 is configured to generate additional rules for the ARM data 282 that are generated based on a decision tree approach. Specifically, the controller 266 constructs a decision tree with the cluster ids of the input dataset as the targets (e.g. the "leaves"). The resulting decision tree gives the user a representation of exactly how various sensors contribute to the system being in a particular cluster. The decision tree is translated into a set of rules (either by the controller 266 or by a human viewing the decision on the display device 224), this time with the cluster ids in the consequent.

In one embodiment, during the ARM process performed by the controller 266, quantitative attributes of the sensor data 270 and the secondary data 276 are partitioned to fixed size ranges based on a selected strategy. After the partitions are created, the partitions remain unchanged during the ARM process. One partitioning method is to divide the target sensor range into equal size intervals (quantiles). Another partitioning method is to create the partitions in a way that there will be an equal number of data points in each interval, and the intervals may have different lengths.

In another embodiment, during the ARM process performed by the controller 266, a size of the intervals are dynamically adjusted during the ARM process. The quantitative features are divided to small intervals at the beginning of the ARM process, and then the ranges are merged based on specific criteria. To make the process practical for large datasets, the merging process stops when the calculated support for the merged interval is higher than another threshold (maximum support).

Next, as shown in block 370 of the flowchart of FIG. 2, the energy control system 116 adjusts or changes an operating characteristic of the HVAC system 108 based on the rules of the ARM data 282 to optimize the monitored parameter of the HVAC system 108. Typically, the operating characteristic change is made to improve the energy efficiency of the HVAC system 108. Moreover, the operating characteristic change is influenced by the identified interesting, insightful, and/or pertinent rules of the ARM process. Interpretation of the rules of the ARM data 282 is described further below. The specific change to the HVAC system 108 may include a change to the setpoint temperature of the thermostat 180, for example, which causes the HVAC system 108 to use less electrical energy during a particular time period. Or the change to the operating characteristic of the HVAC system 108 may include a change to the time at which the HVAC system 108 is activated based on an upcoming weather event, such as when a cold snap is approaching.

Other changes that may be made based on the method 350 include changes to the diffusor 176 settings to more "intelligently" heat or cool the structure 104. For example, in some embodiments the ARM data 282 is generated using secondary data 276 based on the water heating system 112. In such an embodiment, based on water usage (i.e. the cold water flow sensor 294 and the hot water flow sensor 290) the energy control system 116 may determine rules indicating that the second floor of the structure 104 is unoccupied on Tuesdays and Thursday. A change to the HVAC system 108 may be implemented by adjusting the state of the diffusors 176 and/or the corresponding thermostat 180 so that the HVAC system 108 is not used to heat (or to cool) the second floor on Tuesdays and Thursdays.

The method 350 provides data corresponding to an "interpretation" of the identified clusters 310 of sensor data 270 that are used to forecast the energy requirements of the HVAC system 108. Specially, with reference again to FIG. 4, the following insights were gleaned from the clustered data 274 as a result of the ARM data 282. Using the method 350 and comparing the ARM data 282 to the opinions of a human expect, it was determined that Clusters 1 and 3 of FIG. 4 correspond to periods of no heating; Cluster 2 corresponds to heating in the winter during working hours, Cluster 4 corresponds to heating in the winter during non-working hours, and Cluster 5 corresponds to baseload heating requirement through the calendar year. Moreover, using the ARM data 282, expected outside temperature, and a calendar date of interest, the energy control system 116 is configured to forecast the expected energy usage of the HVAC system 108. Such data enables a building operator to plan for utility expenditures and also to take advantage of the time-variant pricing (i.e. time of use (TOU) plans) of electricity if located in such a market.

The data provided by the method 350 may be displayed by the display device 224 using the GUI 232 in a human understandable format. Moreover, each function of the energy control system 116 is controllable remotely using the remote computer 120.

The method 350 exemplified by the flowchart of FIG. 2 is different from existing approaches in a number of ways. First, the method 350 produces explanatory rules in long-term energy usage for large datasets that are useful in forecasting energy demands and current operating states. Second, the method 350 uses clustering to find interesting patterns and to provide explanatory rules about these patterns by applying ARM on TD data including secondary data 276 (including temporal ranges and other building sensors). None of the known systems and methods use clustering as a strategy to find initial patterns that are then explained via the use of ARM.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of operating a heating ventilation and air conditioning (HVAC) system of a structure, comprising:
   collecting energy consumption data corresponding to an energy consumption of the HVAC system;
   collecting temperature data corresponding to an outdoor air temperature at the structure;
   collecting secondary data corresponding to at least one operating characteristic of the HVAC system;
   forming a plurality of data points relating the energy consumption data to the temperature data;

generating clustered data by clustering the data points of the plurality of data points into a plurality of data clusters with a controller, the clustered data identifying at least in which data cluster of the plurality of data clusters each data point of the plurality of data points has been clustered;

forming a transactional dataset using the controller, the transactional dataset including at least (i) the energy consumption data, (ii) the temperature data, (iii) the clustered data, and (iv) the secondary data;

performing association rule mining (ARM) on the transactional dataset to generate a plurality of rules for each data cluster of the plurality of data clusters with the controller, wherein each rule of the plurality of rules relates the secondary data to the energy consumption data;

merging the rules of the plurality of rules to form a plurality of merged rules;

changing the at least one operating characteristic of the HVAC system based on only the plurality of merged rules with the controller to optimize the energy consumption of the HVAC system.

2. The method of operating the HVAC system as claimed in claim 1, further comprising:
generating the energy consumption data with an electrical power sensor operably connected to the HVAC system and the controller; and
generating the temperature data with an outdoor temperature sensor located at the structure and operably connected to the controller.

3. The method of operating the HVAC system as claimed in claim 1, wherein the at least one operating characteristic includes a selected ventilation setting of a plurality of ventilation settings of the HVAC system.

4. The method of operating the HVAC system as claimed in claim 1, wherein the at least one operating characteristic includes at least one of a hot water flow rate, a cold water flow rate, a hot water temperature, and a hot water return temperature of a water heating system of the structure.

5. The method of operating the HVAC system as claimed in claim 1, further comprising:
ranking the rules of the plurality of rules to identify a plurality of pertinent rules.

6. The method of operating the HVAC system as claimed in claim 5, wherein ranking the rules of the plurality of rules comprises:
assigning a Lift value to each rule of the plurality of rules; and
identifying the plurality of pertinent rules as the rules of the plurality of rules having a lift that deviates from one by more than a predetermined margin.

7. An energy control system for controlling an HVAC system of a structure, comprising:
a first sensor operably connected to the HVAC system and configured to generate energy consumption data corresponding to an energy consumption of the HVAC system;
a second sensor operably connected to the structure and configured to generate temperature data corresponding to an outdoor air temperature at the structure;
at least one third sensor operably connected to the HVAC system and configured to generate secondary data corresponding to at least one operating characteristic of the HVAC system; and
a controller operably connected to the first sensor, the second sensor, and the at least one third sensor, and configured to execute program instructions to:
form a plurality of data points relating the energy consumption data to the temperature data;
generate clustered data by clustering the data points of the plurality of data points into a plurality of data clusters, the clustered data identifying at least in which data cluster of the plurality of data clusters each data point of the plurality of data points has been clustered;
form a transactional dataset including at least (i) the energy consumption data, (ii) the temperature data, (iii) the clustered data, and (iv) the secondary data;
perform association rule mining (ARM) on the transactional dataset to generate a plurality of rules for each data cluster of the plurality of data clusters, wherein each rule of the plurality of rules relates the secondary data to the energy consumption data;
merge the rules of the plurality of rules to form a plurality of merged rules; and
change the at least one operating characteristic of the HVAC system based on only the plurality of merged rules to optimize the energy consumption of the HVAC system.

8. The energy control system as claimed in claim 7, wherein the at least one operating characteristic includes a selected ventilation setting of a plurality of ventilation settings of the HVAC system.

9. The energy control system as claimed in claim 7, wherein the at least one operating characteristic includes at least one of a hot water flow rate, a cold water flow rate, a hot water temperature, and a hot water return temperature of a water heating system of the structure.

10. The energy control system as claimed in claim 7, wherein the controller is further configured to execute the program instructions to:
rank the rules of the plurality of rules to identify a plurality of pertinent rules.

11. The energy control system as claimed in claim 10, wherein the controller is further configured to execute the program instructions to:
assign a lift value to each rule of the plurality of rules; and
identify the plurality of pertinent rules as the rules of the plurality of rules having a lift that deviates from one by more than a predetermined margin.

* * * * *